United States Patent
van den Boomen

(10) Patent No.: US 8,383,954 B2
(45) Date of Patent: Feb. 26, 2013

(54) WARPAGE PREVENTING SUBSTRATES

(75) Inventor: Rene Wilhelmus Johannes Maria van den Boomen, Asten (NL)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 876 days.

(21) Appl. No.: 11/917,613

(22) PCT Filed: Jun. 23, 2006

(86) PCT No.: PCT/IB2006/052067
§ 371 (c)(1),
(2), (4) Date: Aug. 14, 2008

(87) PCT Pub. No.: WO2006/137043
PCT Pub. Date: Dec. 28, 2006

(65) Prior Publication Data
US 2009/0103274 A1    Apr. 23, 2009

Related U.S. Application Data

(60) Provisional application No. 60/693,648, filed on Jun. 24, 2005.

(51) Int. Cl.
*H05K 1/02* (2006.01)
(52) U.S. Cl. ........ 174/262; 174/250; 361/760; 361/720; 716/137
(58) Field of Classification Search .......... 361/751, 361/760, 782, 783, 720, 748; 174/250–262; 716/137
See application file for complete search history.

(56) References Cited

U.S. PATENT DOCUMENTS

| | | | | |
|---|---|---|---|---|
| 4,104,111 A | * | 8/1978 | Mack | 216/18 |
| 4,426,767 A | * | 1/1984 | Swanson et al. | 438/180 |
| 4,487,654 A | * | 12/1984 | Coppin | 216/18 |
| 4,512,829 A | * | 4/1985 | Ohta et al. | 216/17 |
| 4,720,324 A | * | 1/1988 | Hayward | 216/18 |
| 4,842,699 A | * | 6/1989 | Hua et al. | 205/126 |
| 5,038,132 A | * | 8/1991 | Lindblom et al. | 338/307 |
| 5,160,579 A | * | 11/1992 | Larson | 216/18 |
| 5,473,119 A | | 12/1995 | Rosenmayer et al. | |
| 5,680,701 A | * | 10/1997 | Sippel | 29/852 |
| 5,987,744 A | * | 11/1999 | Lan et al. | 29/852 |

(Continued)

FOREIGN PATENT DOCUMENTS

| | | |
|---|---|---|
| JP | 06-077398 | 3/1994 |
| JP | 2003-087094 | 3/2003 |

OTHER PUBLICATIONS

Japanese Office Action, Office Action mailed Aug. 17, 2010, Application No. 2008-517691, 3 pages.

(Continued)

*Primary Examiner* — Angel R Estrada
*Assistant Examiner* — Dimary Lopez
(74) *Attorney, Agent, or Firm* — Haynes and Boone, LLP

(57) ABSTRACT

Consistent with an example embodiment, there is an apparatus comprising a circuit (500) board. The circuit board includes a first surface (501*a*) and a second surface (501*b*). The first and second surfaces each have at least a component populated thereon; the circuit board has a first surface thereof populated before a second surface thereof and is overmolded. The circuit board has conductive material disposed over areas of the second surface defining at least a feature (504) on the second surface. The at least a feature is defined by the conductive material and other than defined by solder resist (508) disposed on the second surface overlapping the conductive material, wherein the at least a feature is a feature for remaining exposed during a process of populating the first surface other than a fiducial.

11 Claims, 10 Drawing Sheets

U.S. PATENT DOCUMENTS

| | | | |
|---|---|---|---|
| 6,011,694 | A | 1/2000 | Hirakawa |
| 6,034,427 | A * | 3/2000 | Lan et al. ............... 257/698 |
| 6,351,393 | B1 * | 2/2002 | Kresge et al. ............ 361/795 |
| 6,373,717 | B1 * | 4/2002 | Downes et al. ........... 361/795 |
| 6,531,766 | B1 | 3/2003 | Taniguchi et al. |
| 6,565,954 | B2 * | 5/2003 | Andou et al. ............. 428/209 |
| 6,573,610 | B1 * | 6/2003 | Tsai ........................ 257/780 |
| 6,627,986 | B2 * | 9/2003 | Ishihara et al. ........... 257/690 |
| 6,711,812 | B1 * | 3/2004 | Lu et al. .................. 29/852 |
| 6,835,897 | B2 | 12/2004 | Chang et al. |
| 6,864,434 | B2 * | 3/2005 | Chang et al. ............. 174/255 |
| 7,122,746 | B2 * | 10/2006 | Higuchi et al. ........... 174/262 |
| 2003/0194830 | A1 | 10/2003 | Chung |
| 2004/0022000 | A1 | 2/2004 | Schmitz |
| 2004/0084205 | A1 | 5/2004 | Chang et al. |
| 2004/0238211 | A1 * | 12/2004 | Momokawa et al. ...... 174/260 |
| 2005/0017058 | A1 | 1/2005 | Ho et al. |

OTHER PUBLICATIONS

Chinese Patent Office, Office Action dated Nov. 21, 2011, Application No. 200680022524.4, 3 pages.

* cited by examiner

WARPAGE PREVENTING SUBSTRATES

The instant invention relates to substrates for use in semiconductor packages. In particularly, the instant invention relates to a flat-bottom design substrate that is use in preventing warpage and method of making same.

A substrate for use as a chip carrier in a semiconductor package is generally formed with a core layer made of a resin material. A copper film is attached to opposing upper and lower surfaces of the core layer respectively, and subjected to exposing, developing and etching processes to pattern the copper film to form a plurality of conductive traces. When used in package fabrication processes, the upper and lower surfaces of the core layer usually function differently. For example, in RF modules a number of components are assembled at the upper surface of the substrate, both with flip-chip technology and with wire bond technology and SMD-passive components including a power transistor. The components at the upper surface are overmolded, so as to protect the components from moisture and dirt. A heat sink is provided at the lower surface to dissipate heat that is carried by thermal vias extending from the upper surface, through the substrate, to the lower surface. The thermal vias are filled with copper and with epoxy filler. Also at the lower surface, one or more LGA (Land Grid Array) and/or BGA (Ball Grid Array) is present. One major problem that is encountered during package fabrication processes is deformation of the substrate. In addition, cracks are often produced in or near the thermal vias, especially the thermal vias located near to the edge of the heat sink.

The prior art has attempted to solve the problem of substrate warpage by, for instance, addressing coefficient of thermal expansion (CTE) mismatch. U.S. Pat. No. 5,473,119 of Rosenmayer et al. (Issued on Dec. 5, 1995) discloses a substrate with stress absorbing means, composed of a support or core layer, a stress-relieving layer and a conductive layer having a plurality of traces. The stress-relieving layer absorbs the CTE-induced stress effect when an electrical element is mounted and electrically connected to the substrate via a variable temperature process. Unfortunately, the stress-relieving layer increases the thickness of the substrate and increases production complexity and cost of the substrate.

U.S. Pat. No. 6,835,897 of Chang et al. (Issued on Dec. 28, 2004) discloses a warpage preventing substrate having a plurality of first conductive traces and a plurality of first non-functional traces provided on a first surface thereof, and having a plurality of second conductive traces and a plurality of second non-functional traces provided on a second surface thereof. The first non-functional traces are arranged in different density from the second non-functional traces, so as to allow stress generated from the first conductive traces and first non-functional traces on the first surface of the substrate to counteract stress generated from the second conductive traces and second non-functional traces on the second side. However, providing non-functional traces having suitable density for balancing the stress that is generated at the two opposite surface of the substrate results in increased manufacturing complexity, and may limit the area of substrate that is useable for mounting electrical components.

There is a need to provide a warpage-preventing substrate that overcomes at least some of the above-mentioned limitations of the prior art.

In an embodiment of according to the present invention there is provided an apparatus. The apparatus comprises a circuit board including a first surface and a second surface; the first and second surfaces each have at least a component populated thereon; the circuit board has a first surface thereof populated before a second surface thereof and for being over molded. The circuit board has conductive material disposed over areas of the second surface defining at least a feature on the second surface. The at least a feature is defined by the conductive material and other than defined by solder resist disposed on the second surface, overlaps the conductive material. The at least a feature is a feature remains exposed during a process of populating the first surface other than a fiducial.

In another embodiment according to the present invention there is provided a method of designing a circuit board. The method comprises providing a circuit design; laying out the circuit to result in a circuit board such that some components are to be populated on a first surface of a circuit board and another component is to be populated on a second other surface of the circuit board. The first surface for is overmolded and a layer of solder resist to the second surface of the circuit board is added. The solder resist is added in a fashion resulting in the solder resist remaining approximately coplanar with the conductive features on the second surface.

In another embodiment according to the present invention there is provided a storage medium having stored thereon instruction data. The instruction data for when executed results in the following: receiving a circuit design; laying out the circuit to result in a circuit board such that some components are to be populated on a first surface of a circuit board and another component is to be populated on a second other surface of the circuit board, the first surface for being overmolded; and adding a layer of solder resist to the second surface of the circuit board, the solder resist added in a fashion resulting in the solder resist remaining approximately coplanar with the conductive features on the second surface.

The above summaries of the present invention are not intended to represent each disclosed embodiment, or every aspect, of the present invention. Other aspects and example embodiments are provided in the figures and the detailed description that follows.

Exemplary embodiments of the invention will now be described in conjunction with the following drawings, in which similar reference numbers designate similar items:

The following description is presented to enable a person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and the scope of the invention. Thus, the present invention is not intended to be limited to the embodiments disclosed, but is to be accorded the widest scope consistent with the principles and features disclosed herein.

As was discussed supra it is known to prevent or reduce substrate warpage or deformation caused by CTE mismatch. The instant inventors have now realized that making the lower surface of the substrate substantially planar or conformal to the carrier used during the molding process prevents or reduces substrate warpage and cracks in the vias. Preferably, the entire lower surface of the substrate is planar or conformal to the carrier. Optionally, only a portion of the lower surface of the substrate is planar or conformal to the carrier, such as for instance a portion of the lower surface proximate the heat sink.

Figure 1:
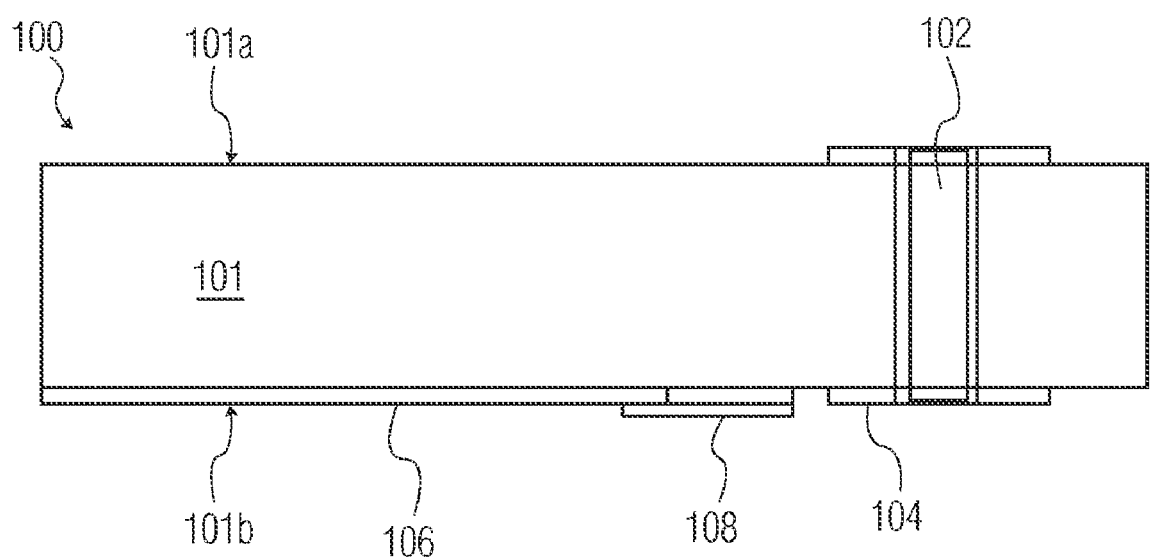
FIG. 1 (Prior Art) is a schematic cross-sectional view of a circuit board 100.

Referring to FIG. 1, shown is a schematic cross-sectional view of a circuit board 100 according to the prior art. The board 100 includes a substrate 101 in the form of a plurality of sandwiched layers shown having a via 102 extending therethrough. The substrate has a top surface 101a and a bottom surface 101b. At a bottom end of the via 102 is a contact 104 formed of a conductive material in the form of copper. Also shown is heat sink 106 formed of a heat conductive material in the form of copper and solder resist 108 disposed on (below) the contact 106 and to the side thereof.

Figure 2:
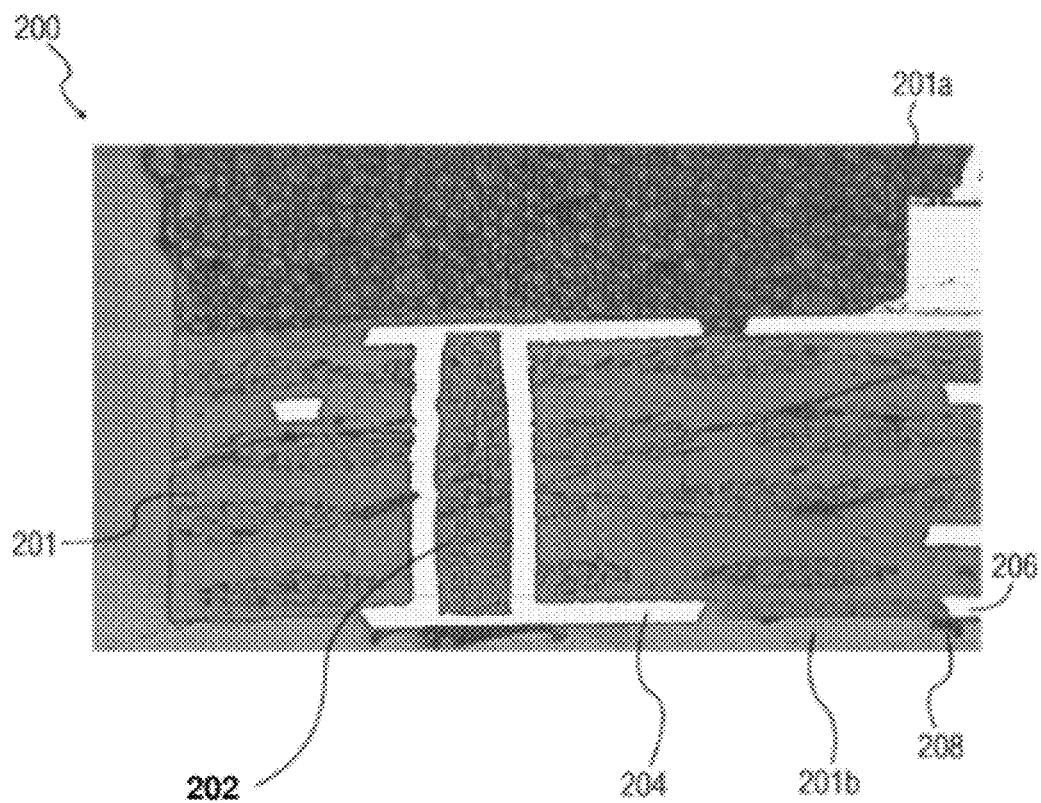
FIG. 2 (Prior Art) is a magnified cross sectional view of a circuit board 200 designed and manufactured according to the prior art and shown in schematic view in FIG. 1.

Referring to FIG. 2, shown is a magnified cross sectional view of a circuit board 200 designed and manufactured according to the prior art and shown in schematic view in FIG. 1. A substrate 201 in the form of a plurality of sandwiched epoxy layers is shown having a via 202 therethrough. The substrate has a top surface 201a and a bottom surface 201b. At a bottom end of the via 202 is a contact 204 formed of a conductive material in the form of copper. Also shown is heat sink 206 formed of a heat conductive material in the form of copper and solder resist 208 disposed on (below) the heat sink 206 and to the side thereof. The circuit board viewed in cross section has been previously overmolded and, as is evident the top surface 201a of the substrate 201 is warped.

Figure 3A:
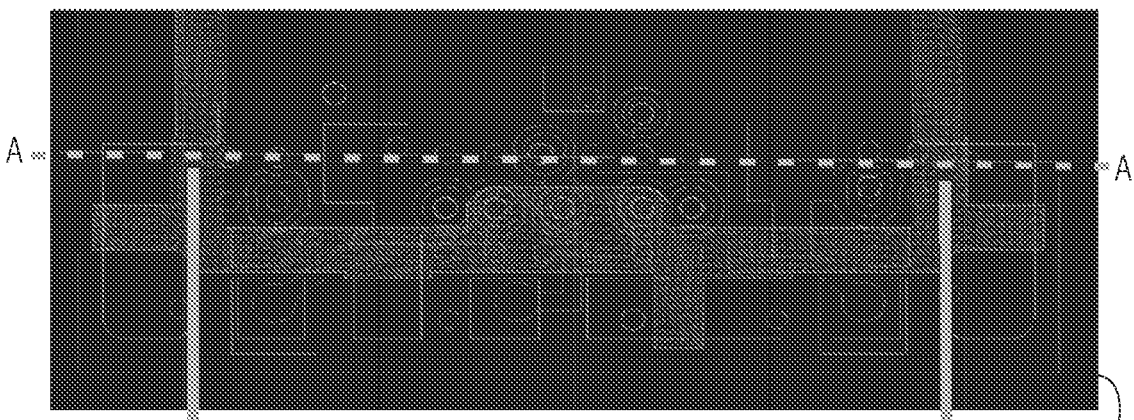
FIG. 3A (Prior Art) is a top layout diagram view of the prior art circuit board shown in FIG. 1 in cross section.
Figure 3B:
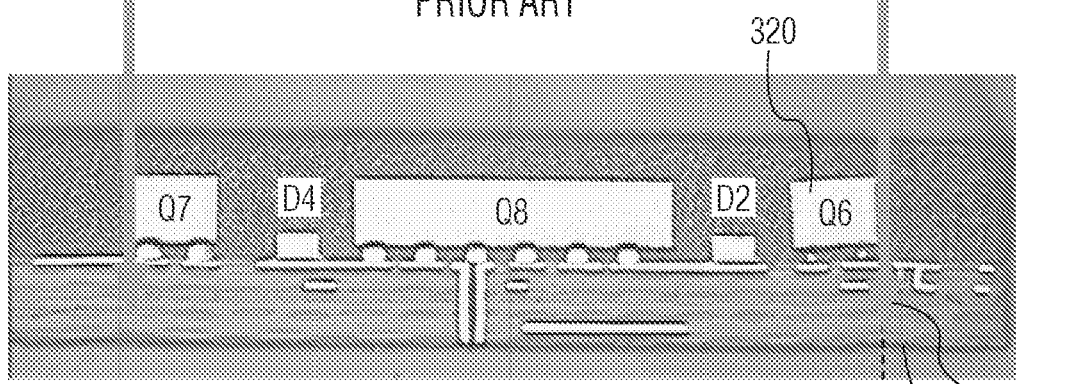
FIG. 3B (Prior Art) is a cross-sectional view taken along line A-A in FIG. 3A.
Figure 3C:
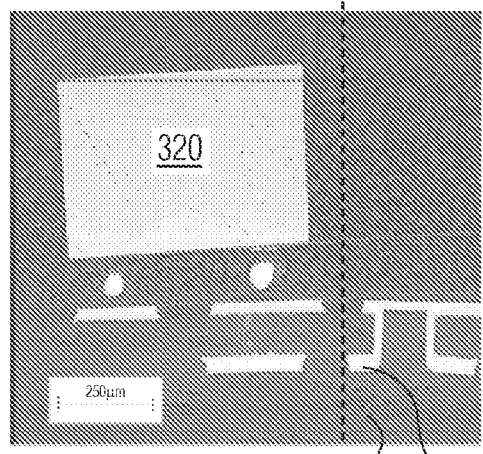
FIG. 3C (Prior Art) is an enlargement of a portion of the cross-sectional view of FIG. 3B.

Referring to FIG. 3A, shown is top layout diagram view of the prior art circuit board shown in FIG. 1 in cross section. FIG. 3B shows a cross sectional view along the line A-A of the circuit board of FIG. 2 circuit board with a top side thereof populated and after overmolding thereof FIG. 3C shows a magnified portion of the cross section of the populated circuit board of FIG. 3B.

Referring to FIG. 3A, a solder mask 310 is shown having conductive surfaces such as 312 thereunder. As is more clearly visible in FIG. 3C, during an overmolding process the top surface of the board shown is warped. This causes circuit component 320 to rest at an angle which is undesirable. In FIG. 3B, it is evident that the entire upper surface of the board does not suffer equally from the warpage, and that the warpage is substantially about locations wherein the bottom surface of the board is uneven.

Figure 4:
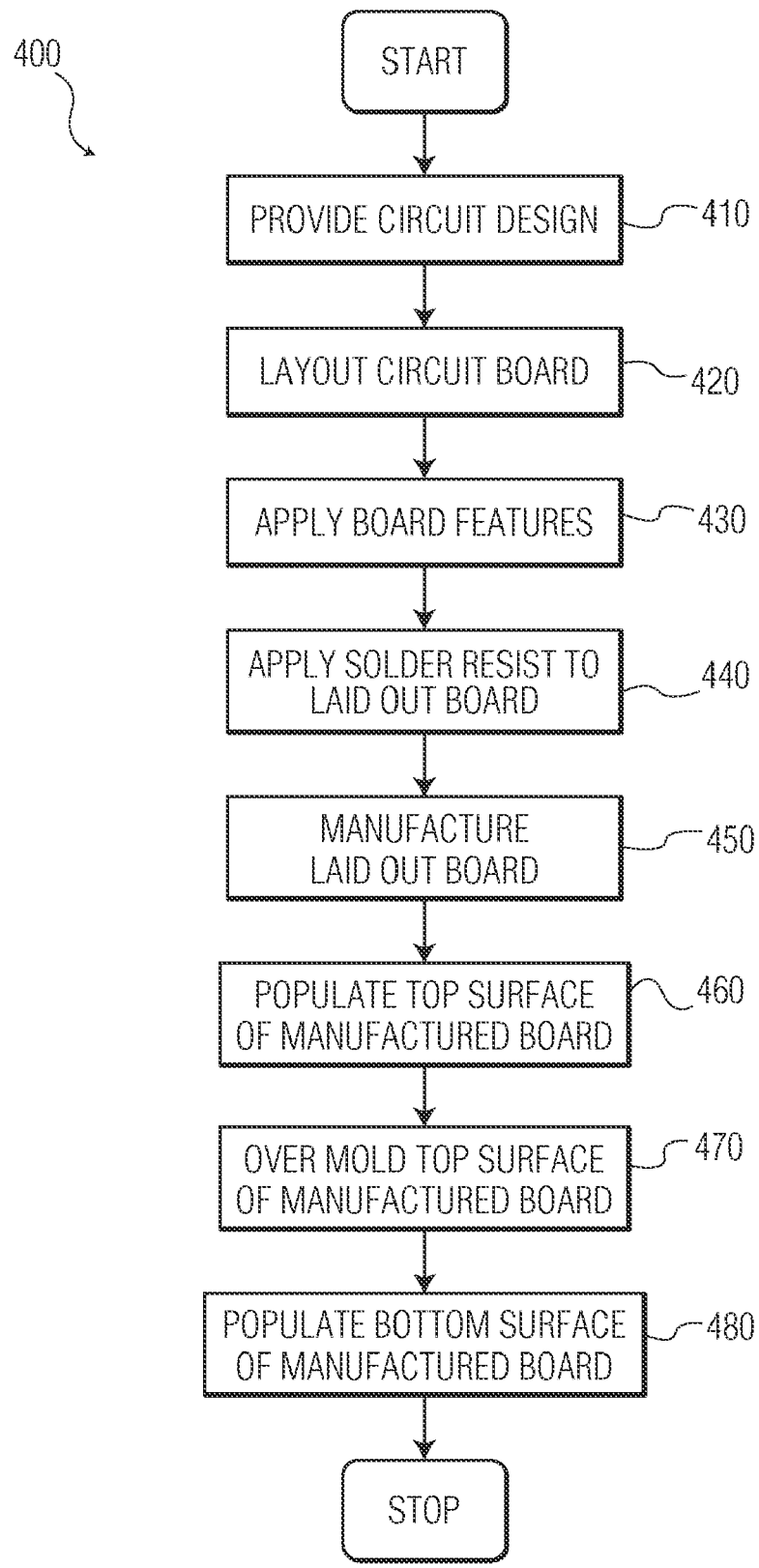
FIG. 4 is a simplified flow diagram of a method of fabricating a circuit board according to an embodiment of the present invention.

Referring to FIG. 4, shown is a simplified flow diagram 400 of a method of fabricating a circuit board according to an embodiment of the instant invention. At step 410, a circuit design is provided for implementation within a circuit board or module. The circuit board is laid out for implementation of the circuit once populated with designated components at step 420. At step 430, board features such as fiducials, heat sinks, and other aspects of the board are applied. At step 440, solder resist is applied to the laid out board. Fiducials serve as reference marks on the substrate to facilitate manufacturing. Here, in accordance with the embodiment, the solder resist for the bottom layer is provided in a fashion that other than overlaps the electrically conductive material in the form of copper on the bottom surface. For example about the edges of the heat sink is disposed the solder resist without touching the surface of the heat sink. In practice, a small gap is provided between the heat sink and the solder resist to account for manufacturing tolerances in order to ensure that the solder resist does not overlap the heat sink. At step 450, the laid out board is manufactured. Alternatively, the solder resist is deposited in an overlapping manner and then the bottom of the board is planarized to remove solder resist where it overlaps the electrically conductive material. At step 460, the manufactured board has its top surface populated. Once populated, the top surface is overmolded at step 470. At step 480, the bottom surface of the board is populated. Thus, a manufactured board or module results.

The relatively flat bottom side of the circuit board provides support for the overmolding process and reduces an occurrence of warpage due to an uneven bottom surface of the circuit board.

Though in the embodiment of FIG. 4 the conductive material is not overlapped by the solder resist material, it is possible within the scope of the invention to have some conductive material overlapped with solder resist where other conductive material is not. For example, when it is found in manufacture that a particular portion of a board warps, it is possible to eliminate solder resist overlap on that portion of the board only in order to rework same.

Figure 5:
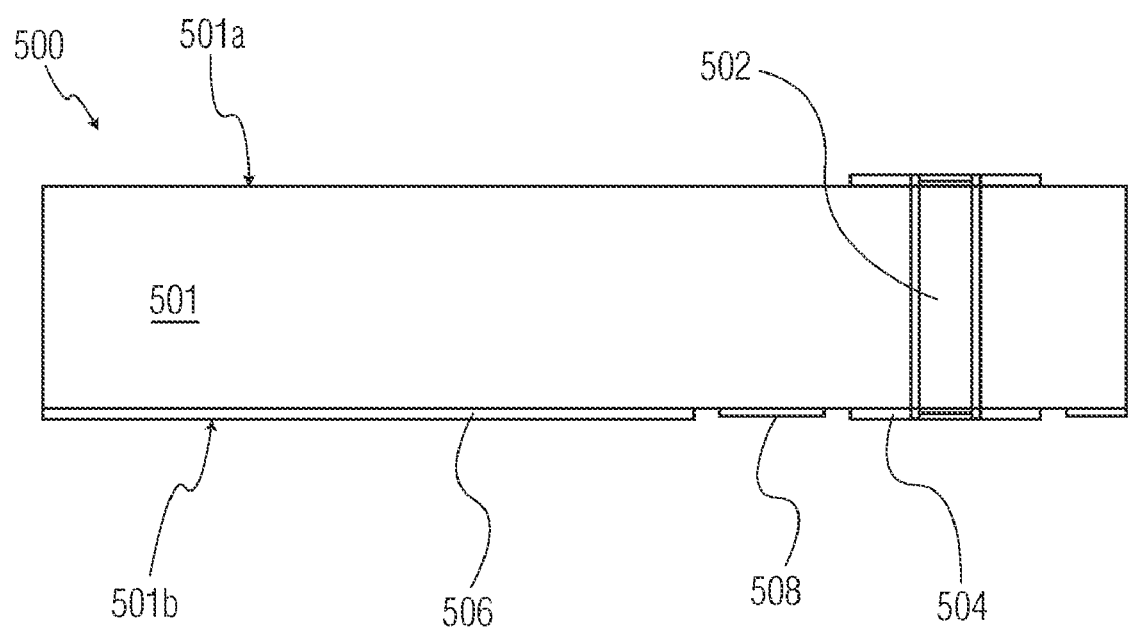
FIG. 5 is a schematic cross-sectional view of a circuit board 500 according to an embodiment of the present invention.

Referring to FIG. 5, shown is a schematic cross-sectional view of a circuit board 500 according to an embodiment of the instant invention. The board 500 includes a substrate 501 in the form of a plurality of sandwiched layers shown having a via 502 extending therethrough. The substrate has a top surface 501a and a bottom surface 501b. At a bottom end of the via 502 is a contact 504 formed of a conductive material in the form of copper. Also shown is heat sink 506 formed of a heat conductive material in the form of copper and solder resist 508 disposed adjacent the contact 504 and to the side thereof and other than overlapping therewith.

Figure 6A:
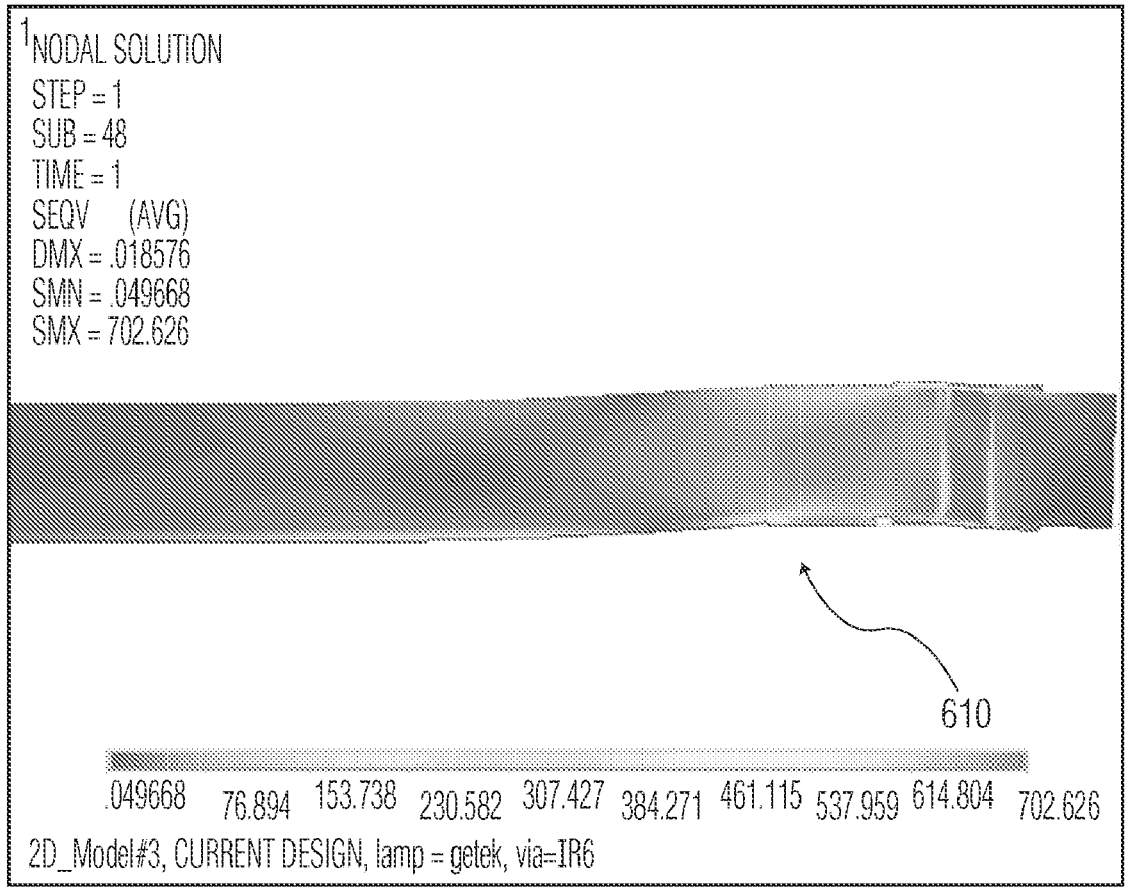
FIG. 6A is simulated stress/deformation diagram data showing Von Mises stress for the circuit board of FIG. 1 after over molding thereof.

Referring to FIG. 6A, shown is simulated stress diagram data 610 showing Von Mises stress for the circuit board of FIG. 1 after overmolding thereof and according to the prior art. As is evident from the diagram, there is significant warpage in the board.

Figure 6B:
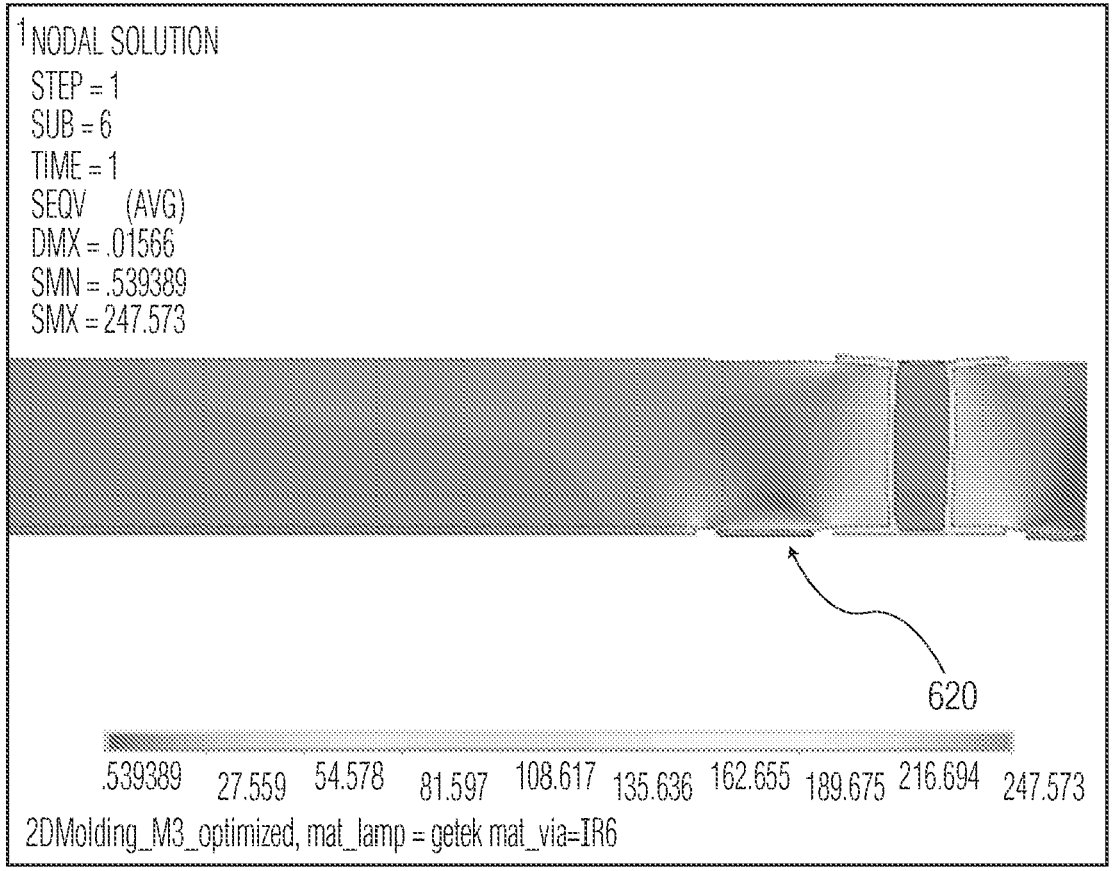
FIG. 6B is simulated stress/deformation diagram data showing Von Mises stress for the circuit board of FIG. 4 after over molding thereof.

Referring to FIG. 6B, shown is simulated stress diagram data 620 showing Von Mises stress for the circuit board of FIG. 4 after overmolding thereof. As is evident from the diagram, there is significantly less stress and warpage present in this board than for the board of FIG. 1. It is apparent that placement of components on the bottom surface of the board is straightforward since the component placement system operates "ideally" for flat surfaces. In general, the resulting quality of the manufactured board is higher.

Figure 7A:
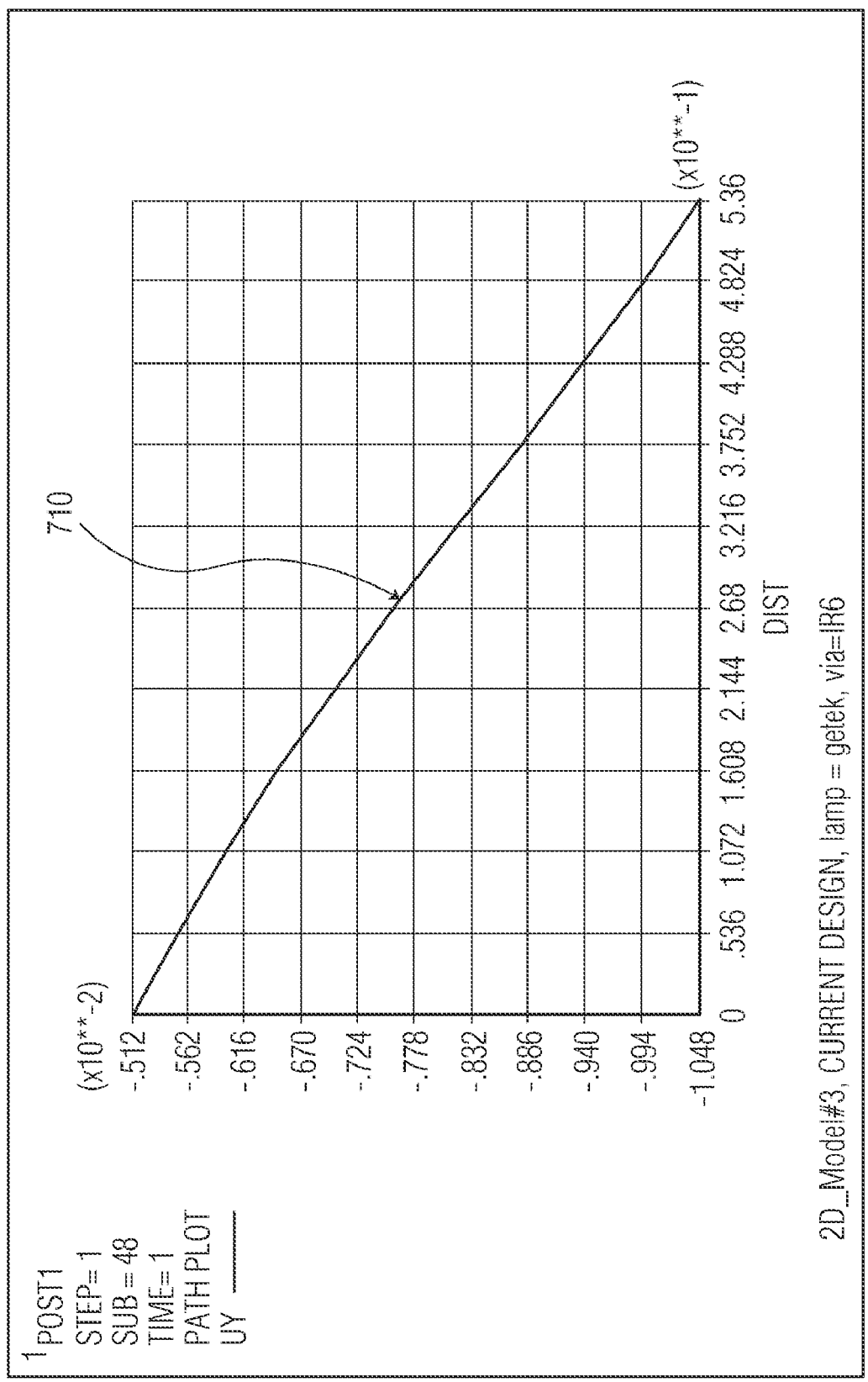
FIG. 7A is simulated data for substrate edge deformation for the circuit board of FIG. 1 after over molding thereof.

Referring to FIG. 7A, shown is simulated data 710 for substrate edge deformation for the circuit board of FIG. 1 after overmolding thereof and according to the prior art.

Figure 7B:
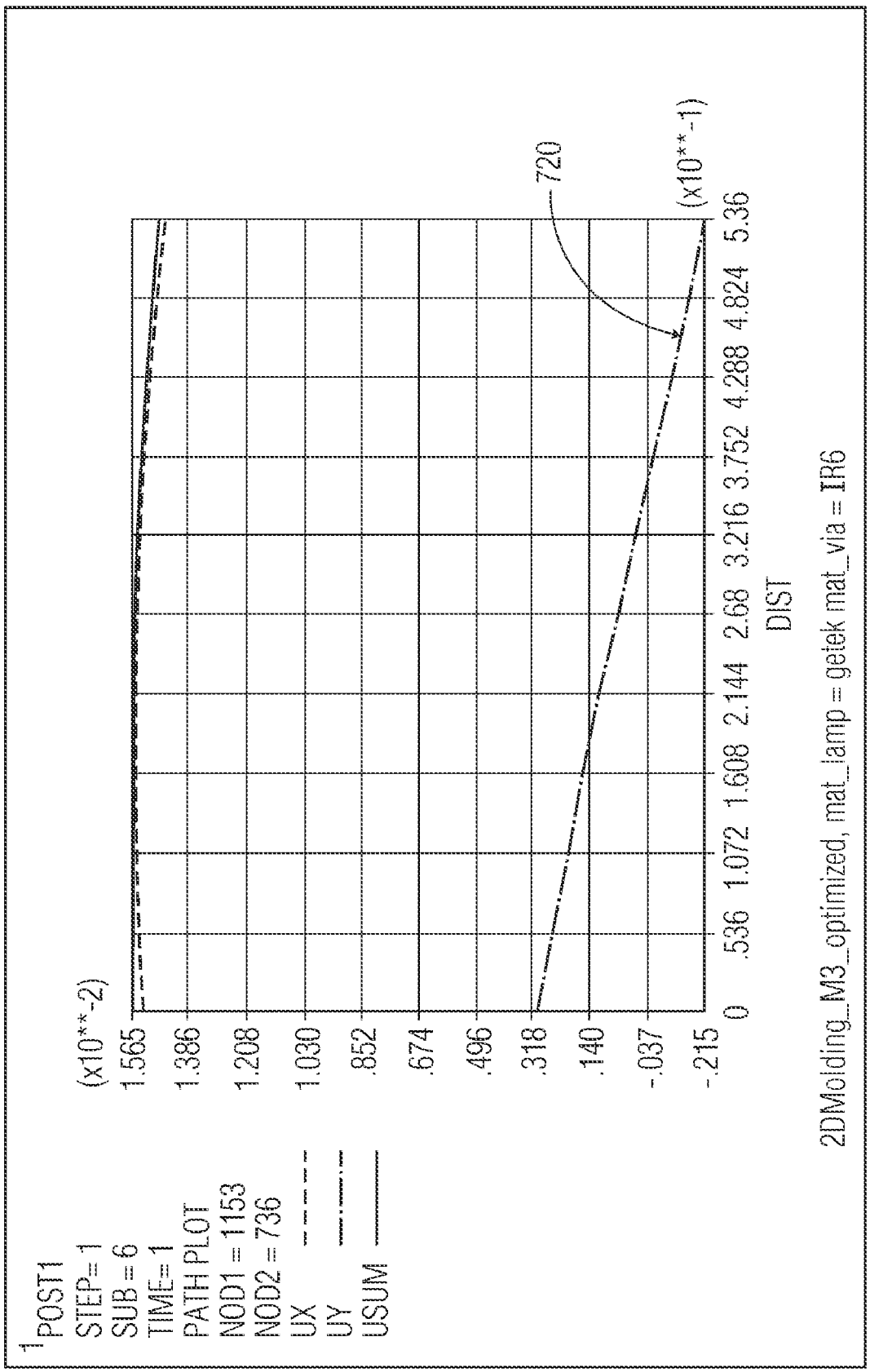
FIG. 7B is simulated data for substrate edge deformation for a the circuit board of FIG. 4 after over molding thereof.

Referring to FIG. 7B, shown is simulated data 720 for substrate edge deformation for the circuit board of FIG. 4 after overmolding thereof. Clearly, edge deformation is reduced through application of the present embodiment of the invention.

Figure 8A:
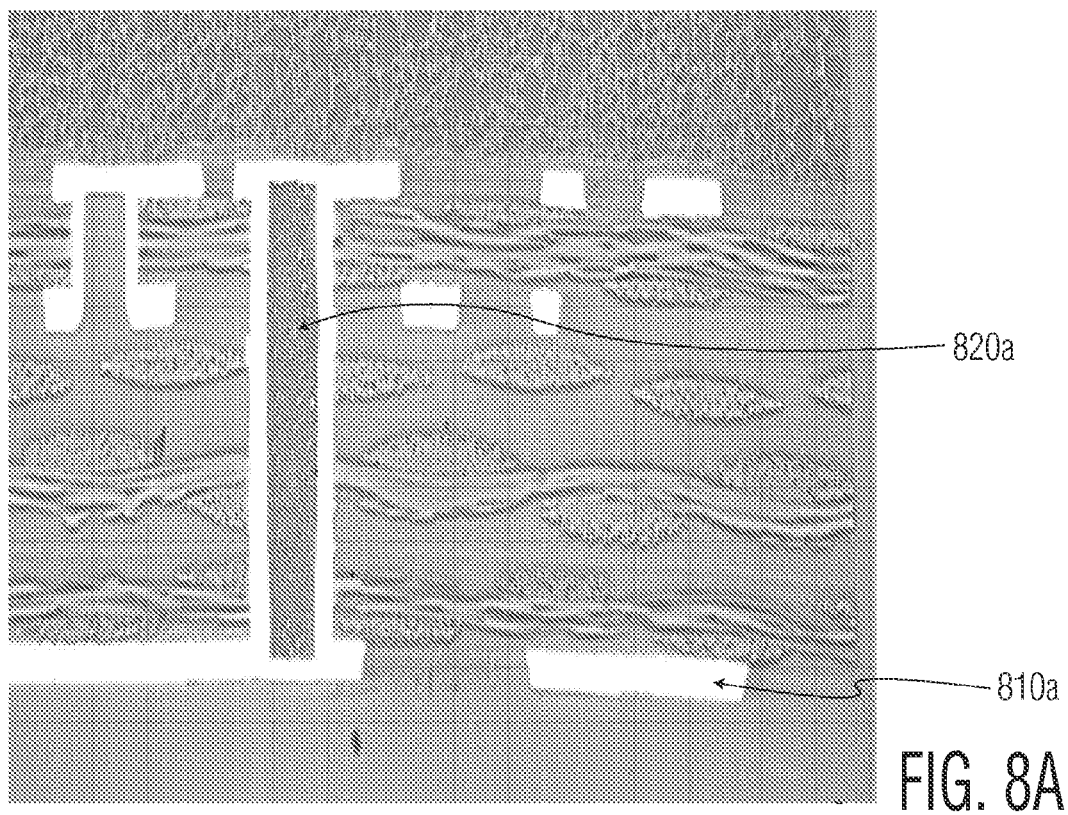
FIG. 8A is a cross-sectional view of a GETEK based substrate after assembly according to the prior art; and, FIG. 8B is a cross-sectional view of a GETEK based substrate after assembly according to an embodiment of the instant invention.
Figure 8B:
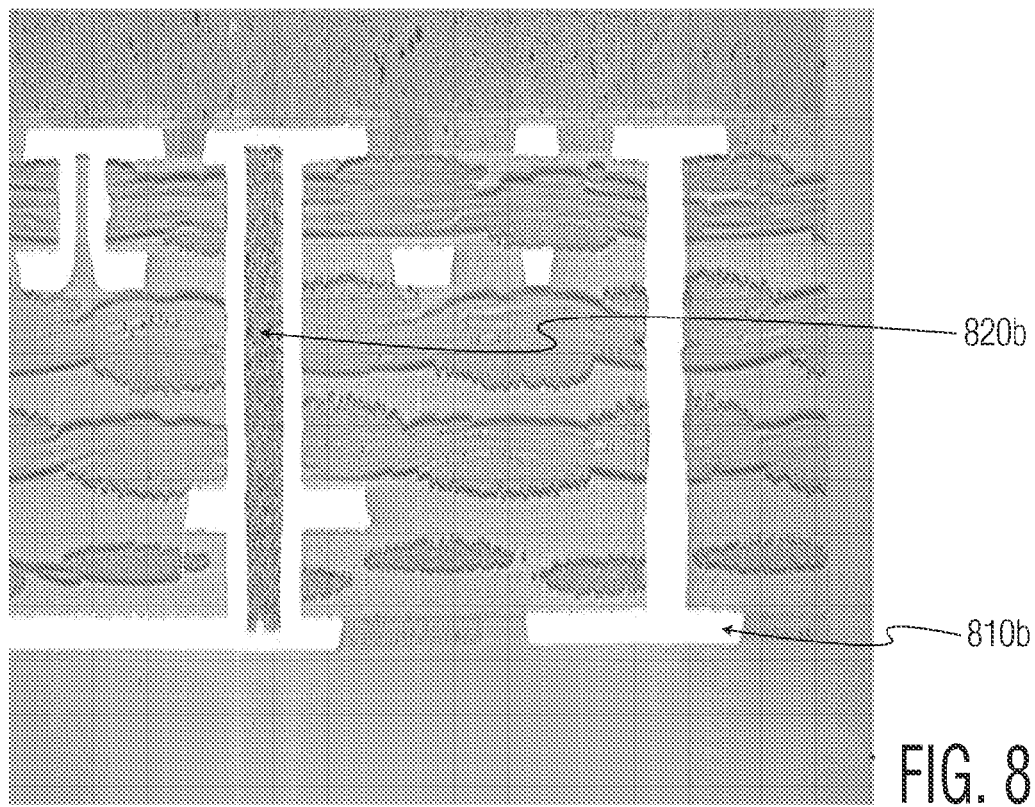

Referring to FIG. 8A, shown is a cross-sectional view of a GETEK based substrate after assembly for a board designed and manufactured according to the prior art. Referring to FIG. 8B, shown is a cross-sectional view of a GETEK based substrate after assembly for a board designed and manufactured according to an embodiment of the instant invention. It is evident from a review of the diagrams that substantially less warpage results when a design according to the instant embodiment is used. For example, conductor 810*a* is at a substantial angle relative to a normal to via 820*a*. In contrast, conductor 810*b* is approximately perpendicular to via 820*b*.

It is apparent to those of skill in the art that retaining a relatively flat surface for assembly is advantageous. It is further evident that warpage of a board during manufacturing is undesirable.

The afore-mentioned embodiments are particularly important for products in which a semiconductor die attached to the topside of the laminate is smaller than the heat sink at the bottom side. In that event, the pressure of the molding compound works on the area on the top side overlying the heat sink rendering the heat sink very vulnerable to warpage.

The above embodiments are particularly useful when map molding is employed in which the complete module is molded in one step.

While the present invention has been described with reference to several particular example embodiments, those skilled in the art will recognize that many changes may be made thereto without departing from the spirit and scope of the present invention, which is set forth in the following claims.

What is claimed is:

1. An apparatus comprising: a circuit board including a first surface and a second surface, the first and second surfaces each for having at least a component populated thereon, the circuit board for having the first surface thereof populated before the second surface thereof and for being overmolded, the circuit board having conductive material disposed directly on and physically contacting the second surface, the conductive material defining at least one feature on the second surface, the at least one feature defined by the conductive material, the circuit board having a solder resist disposed directly on and physically contacting the second surface without overlapping or physically contacting the conductive material, wherein the at least one feature is a feature for remaining exposed during a process of populating the first surface other than a fiducial.

2. The apparatus of claim 1 wherein the at least one feature comprises a heat sink.

3. The apparatus of claim 1 wherein the at least one feature comprises a via.

4. The apparatus of claim 1 wherein on the second surface the solder resist is disposed in substantially a same plane as the conductive features.

5. The apparatus of claim 1 wherein material disposed on the second surface of the board is so disposed in a pattern to prevent warpage of the board during overmolding thereof.

6. The apparatus of claim 1 wherein the second surface has sufficient support along a flat resting plane thereof such that during overmolding the circuit board is other than substantially warped.

7. The apparatus of claim 1 comprising:
circuit components populated on the first surface including at least one through hole component;
overmolding applied to the first surface wherein the circuit board is substantially planar.

8. The apparatus claim 1 wherein the at least one feature is selected from the group consisting of: pads, heat sinks, and vias.

9. A storage medium having stored thereon instruction data, the instruction data for when executed resulting in the following: receiving a circuit design; laying out the circuit to result in a circuit board such that some components are to be populated on a first surface of the circuit board and another component is to be populated on a second other surface of the circuit board, the first surface for being overmolded; forming conductive features directly on the second surface such that the conductive features physically contacts the second surface; and forming a layer of solder resist directly on the second surface of the circuit board such that the solder resist physically contacts the second surface, the solder resist formed in a fashion resulting in the solder resist remaining approximately coplanar with the conductive features on the second surface.

10. The apparatus of claim 1, wherein the solder resist is disposed on the second surface without contacting the conductive material.

11. The storage medium of claim 9, wherein at least one of the conductive features has a top surface and an opposing bottom surface, the top surface of the conductive feature physically contacting the second surface, and
wherein the solder resist has a top surface and an opposing bottom surface, the top surface of the solder resist physically contacting the second surface and the bottom surface of the solder resist being coplanar with the bottom surface of the at least one of the conductive features.

\* \* \* \* \*